United States Patent
Rodriguez et al.

(10) Patent No.: US 10,070,525 B2
(45) Date of Patent: Sep. 4, 2018

(54) INTERNAL TO INTERNAL COAXIAL VIA TRANSITION STRUCTURES IN PACKAGE SUBSTRATES

(71) Applicant: Intel Corporation, Santa Clara, CA (US)

(72) Inventors: Adrian Rodriguez, Cirtus Heights, CA (US); Matthew G. Priolo, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/392,131

(22) Filed: Dec. 28, 2016

(65) Prior Publication Data

US 2018/0184522 A1    Jun. 28, 2018

(51) Int. Cl.
| | |
|---|---|
| *H01L 23/00* | (2006.01) |
| *H05K 1/11* | (2006.01) |
| *H05K 1/02* | (2006.01) |
| *H05K 3/40* | (2006.01) |
| *H01L 23/538* | (2006.01) |

(52) U.S. Cl.
CPC .......... *H05K 1/113* (2013.01); *H01L 23/5384* (2013.01); *H01L 23/5386* (2013.01); *H05K 1/0213* (2013.01); *H05K 3/4038* (2013.01)

(58) Field of Classification Search
CPC .................................................... H05K 1/113
See application file for complete search history.

(56) References Cited

U.S. PATENT DOCUMENTS

| | | |
|---|---|---|
| 9,368,440 B1 | 6/2016 | Hool |
| 2004/0069529 A1* | 4/2004 | Oggioni ................. H01L 23/66 |
| | | 174/262 |
| 2007/0124930 A1* | 6/2007 | Cheng .................. H05K 1/0222 |
| | | 29/852 |
| 2008/0169564 A1* | 7/2008 | Kim ...................... H05K 1/0219 |
| | | 257/758 |
| 2013/0105987 A1 | 5/2013 | Gallegos et al. |
| 2014/0065817 A1 | 3/2014 | Mina et al. |
| 2015/0014045 A1* | 1/2015 | Brigham ................ H05K 1/116 |
| | | 174/266 |
| 2016/0013125 A1 | 1/2016 | Kim et al. |

FOREIGN PATENT DOCUMENTS

WO   2016094252   6/2016

OTHER PUBLICATIONS

International Search Report and Written Opinion for International Patent Application No. PCT/US17/61730, dated Feb. 27, 2018.

* cited by examiner

*Primary Examiner* — William Harriston
(74) *Attorney, Agent, or Firm* — Green, Howard & Mughal LLP

(57) ABSTRACT

Methods/structures of forming package structures are described. Those methods/structures may include forming a first sub-laminated board comprising a first horseshoe structure that is disposed on a top surface of a first outer ground structure, forming a second sub-laminated board comprising a second horseshoe structure disposed on a second outer ground structure, wherein the second sub-laminated board comprises a stripline trace on a top surface of the second sub-laminated board, and laminating the first sub-laminated board to the second sub-laminated board, wherein the first and second horseshoe structures are in contact with each other during the lamination process.

23 Claims, 8 Drawing Sheets

INTERNAL TO INTERNAL COAXIAL VIA TRANSITION STRUCTURES IN PACKAGE SUBSTRATES

BACKGROUND

Coaxial via structures may be used to transfer power and signals vertically through microelectronic packages and circuit boards. Coaxial via structures may be electrically coupled with both external microstrip transmission lines, and internal strip line transmission lines, within a package structure.

BRIEF DESCRIPTION OF THE DRAWINGS

While the specification concludes with claims particularly pointing out and distinctly claiming certain embodiments, the advantages of these embodiments can be more readily ascertained from the following description when read in conjunction with the accompanying drawings in which:

DETAILED DESCRIPTION

Figure 1A:
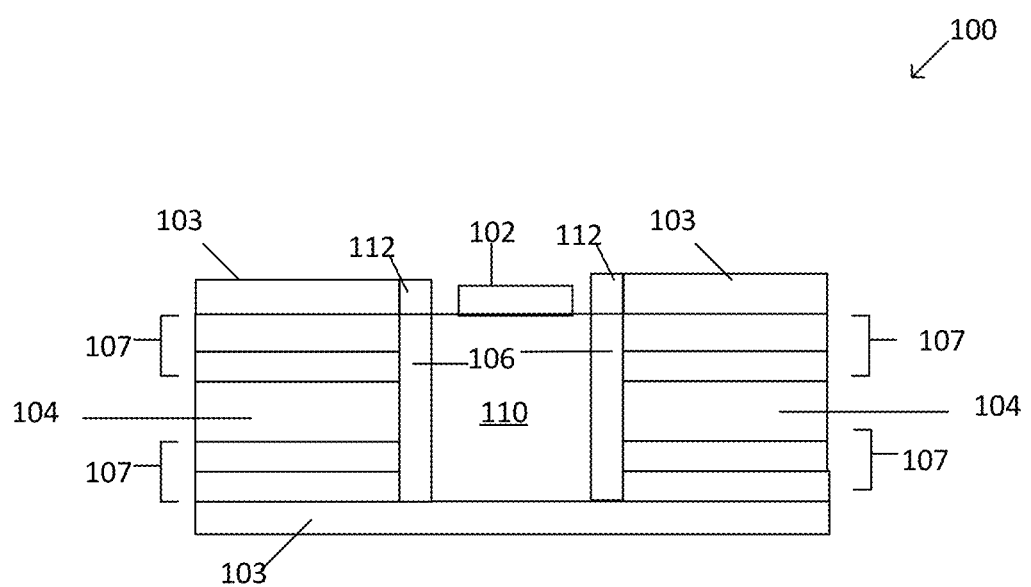
FIG. 1a represents a cross-sectional view of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die/device, in the embodiments below. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

A die/device may comprise any type of integrated circuit device, and may be physically and structurally coupled with a substrate. In one embodiment, the die may include a processing system (either single core or multi-core). For example, a die may comprise a microprocessor, a graphics processor, a signal processor, a network processor, a chipset, etc. In one embodiment, a die comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of device/die.

A typical coaxial via structure may transmit signals in a package structure. It may be coupled with a buried outer ground contact, with an external microstrip, and with an internal strip line, for example. Transitions from an external layer/microstrip, such as an external trace/layer, to an internal layer, such as a strip line structure, could impair the inner layer signal because only half of a return path can be captured by the buried outer ground conductor, in prior art structures. For example, the return path for the microstrip trace may not be adequately compensated by the coaxial via, and may lose half of the return path of the stripline trace. The embodiments herein provide a coaxial via structure which comprises an internal to internal coaxial via transition that fully captures the return path of the inner layer signal. The coaxial via structure of the embodiments herein enable a stripline to stripline transition that maintains the dual return path of the signal. In an embodiment, the be described further herein, two sub laminated coaxial vias may be attached through a horseshoe shaped conductive feature, such as a horseshoe shaped copper feature.

Embodiments of methods of forming packaging structures, such as forming a first sub-laminated board comprising a first horseshoe structure that is disposed on a top surface of a first outer ground structure, forming a second sub-laminated board comprising a second horseshoe structure disposed on a second outer ground structure, wherein the second sub-laminated board comprises a stripline trace on a top surface of the second sub-laminated board, and laminating the first sub-laminated board to the second sub-laminated board, wherein the first and second horseshoe structures are in contact with each other during the lamination process. The embodiments herein enable the formation of a coaxial structure that can connect two internal layers while capturing both return path layers.

The Figures herein illustrate embodiments of fabricating a coaxial structure comprising internal to internal coaxial via structures that are fully capable of capturing the return path of a strip line conductor. In FIG. 1a, a cross sectional view of a portion of package structure 100 is shown, which may comprise a portion of a sub-laminated coaxial via board. In an embodiment, the board may comprise a printed circuit board, or any other type of suitable board/substrate. The sub-laminated coaxial via board 100 may comprise a strip line conductor pad 102.

The strip line conductor pad 102 may comprise a portion of a strip line trace/conductive structure, which may comprise any suitable conductive material, such as copper for example. A strip line trace may be located internally within the board 100. The strip line pad 102 may be disposed on a resin material 110. The resin material 110 may comprise a dielectric material, or another suitable electrically isolating material in other embodiments. An outer ground structure 106 may be adjacent the resin material 106, and may be oriented orthogonally with respect to the strip line pad 102. The outer ground structure 106 may be located on both sides of the resin material 110. In an embodiment, a core material 104 may comprise a portion of a substrate core material. In an embodiment, the core may comprise a dielectric material. The substrate core layer 104 may be a substrate core layer used in, on, or as part of a patch, a die, an interposer, a printed circuit board (PCB), a spacer, and/or some other type of substrate of a package. Generally, the substrate core layer 104 may be formed of some electrically and/or thermally neutral dielectric material such as a resin, epoxy, polytetrafluoroethylene (PTFE), or some other material. Example materials may include an epoxy material such as an FR-4 material.

Figure 1B:
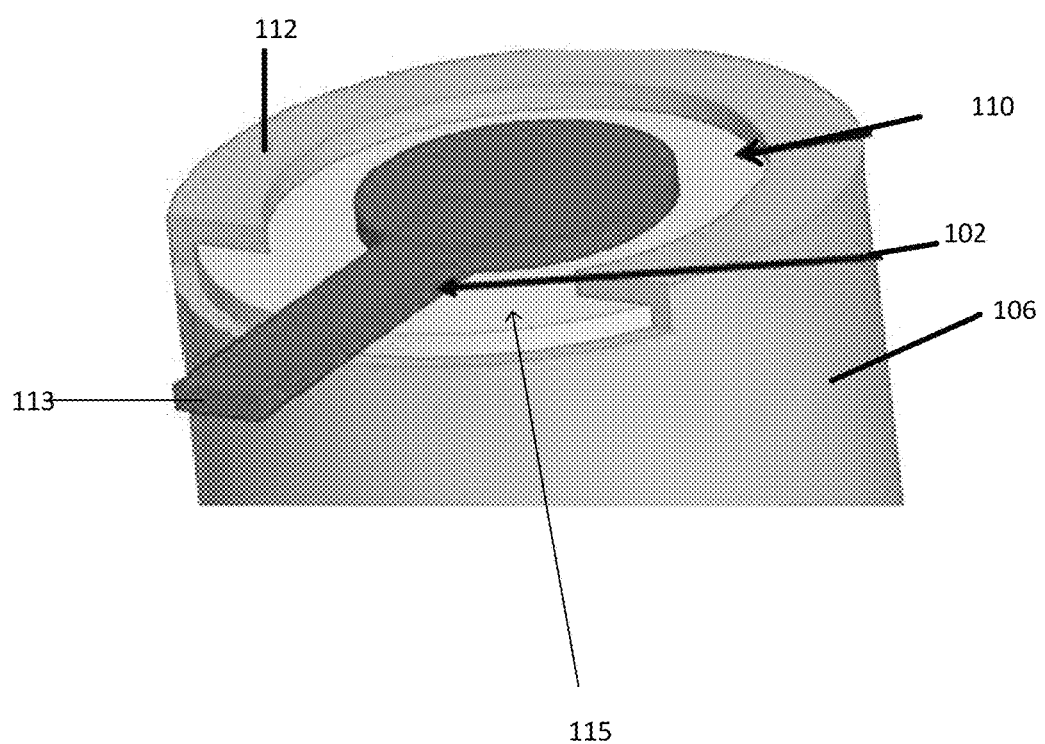
FIG. 1b represents a side perspective view of structures according to embodiments.

The outer ground structure 106 may be adjacent a horseshoe shaped structure 112, that may be disposed on a top surface of the outer ground structure 106, and may be adjacent the strip line pad 102. The horseshoe structure 112 may comprise a portion of the outer ground structure 106, in an embodiment, and may serve to allow for a strip line trace and pad, such as strip line pad 102, to be maintained while capturing a second layer return path, as will be described further herein. A side perspective view of the horseshoe structure 112 is shown in FIG. 1b, wherein the horseshoe structure 112 surrounds a portion of the strip line pad 102 on the resin 110. The horseshoe structure 112 comprises an opening 115 wherein the strip line trace 113 may extend therefrom. The horseshoe structure 112 may comprise a semicircle structure, but may comprise other structures, in some embodiments, as long as there is an opening 115 from which the strip line trace 113 may extend. The strip line trace 113 is coupled with and extends from the strip line pad 102. In an embodiment, the horseshoe structure 112 may be formed by placing/laminating a dielectric material, such as a pre-preg material for example, onto a top surface of the outer ground structure 106. Etchant may be used to remove portions of the pre-preg to form the semi-circle horseshoe structure 112. The opening may be subsequently filled in with a material, such as a conductive paste or plating to form a uniform plane.

Referring back to FIG. 1a, ground planes 107, which may comprise reference planes as appropriate, may be adjacent and physically and electrically coupled to the outer ground structure 106. Dielectric material 103 may be disposed on top and bottom surfaces of the portion of the sub-laminated coaxial via board 100, and may be disposed in other locations within/on the via board 100 as required by the particular design requirements. In an embodiment, two sub-laminated via boards may be attached to each other to allow for an internal to internal coaxial via transition.

Figure 1C:
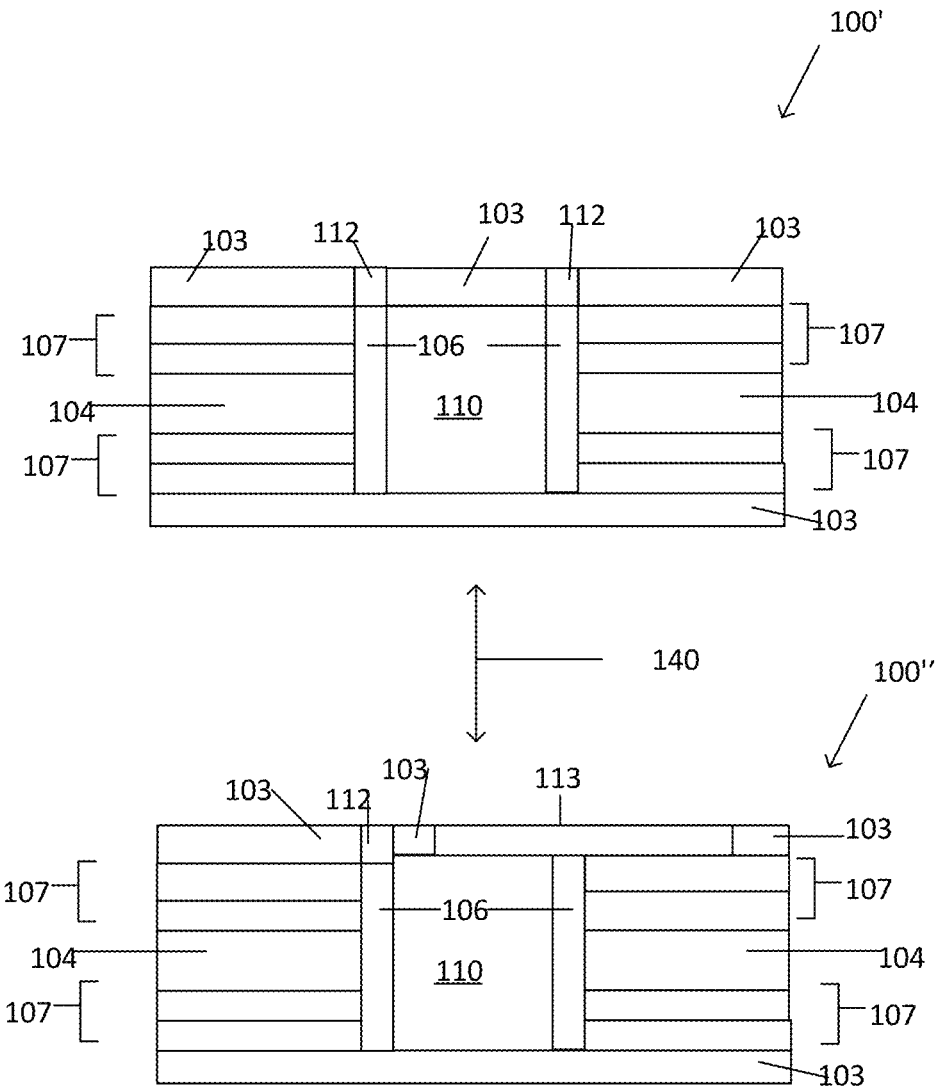
FIGS. 1c-1d represent cross sectional views of structures according to embodiments.

In FIG. 1c, a cross sectional view of a first sub-laminated board 101' and a second sub-laminated board 101" is depicted. The first sub-laminated board 100' may comprise outer ground structure 106 comprising the horseshoe structure 112. The first sub-laminated via board 101' may further comprise resin 106, ground planes/reference planes 107, core material 104, and dielectric material 103. The second sub-laminated via board 101" may comprise similar structures/materials as the first sub-laminated via board 101', and may additionally comprise a strip line trace 113 adjacent to a top surface of a portion of the outer ground structure 106. The first and second sub-laminate via boards 101', 101" may be laminated by using a lamination process 140, onto each other, to form a full outer ground structure barrel 106 of a coaxial via, wherein both of the return paths of the strip line layer may be captured. Utilizing the lamination process 140 using prior art structures without the horseshoe structures, would result in either the internal pad/trace 113 becoming destroyed, and/or only half of the return path of the strip line 113 would be captured by the outer ground structure. The horseshoe structure 112 protects the internal trace including pad 113 from damage during the lamination process 140 of the two boards together. In an embodiment, each sub-laminated via board may contain a buried inner coax via as well, which can be fabricated either with micro vias or with a standard drill bit.

Figure 1D:
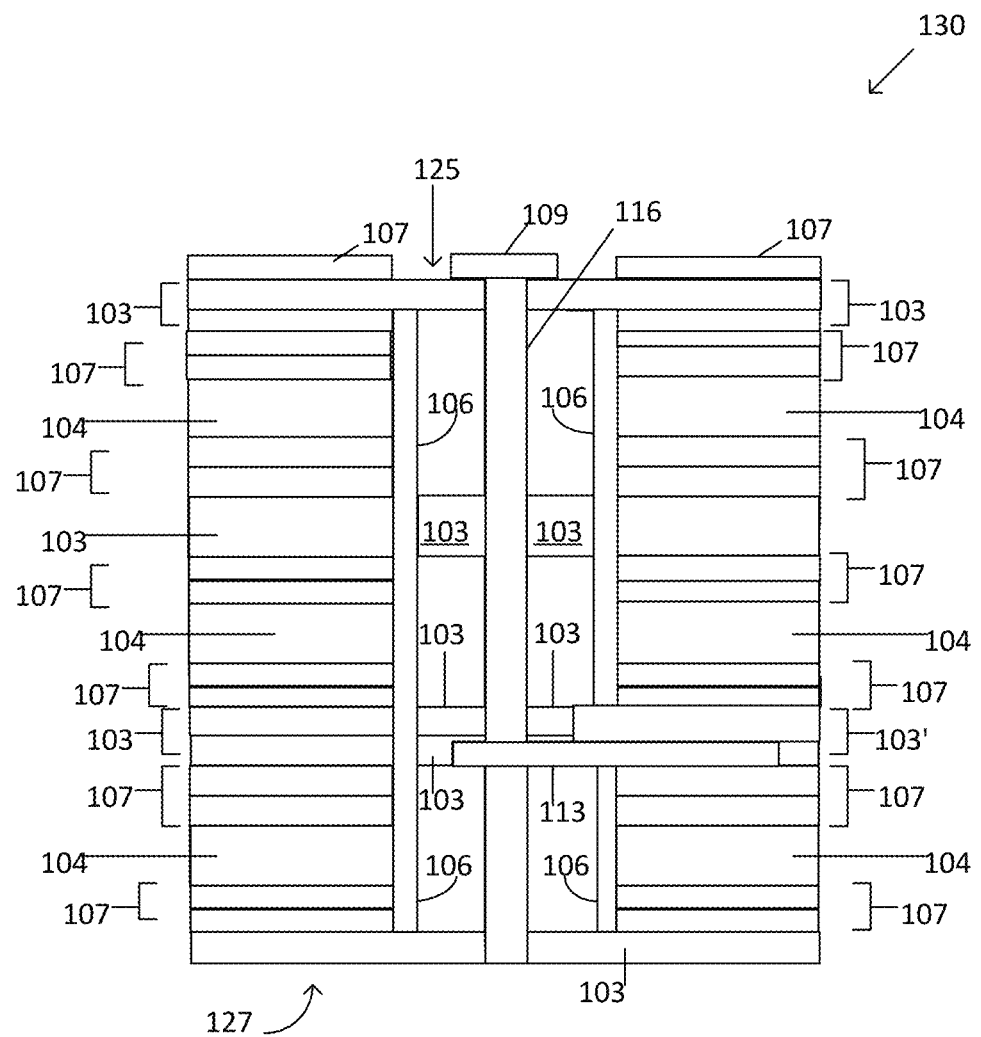

The horseshoe rings/structures on both laminated via boards 101', 101" will touch/mate with each other during the lamination process 140, leaving the trace 113 unaffected. In another embodiment, once all the layers are laminated together, a final drilling (to form an opening within the resin and through the stripline trace 113) and plating step may be performed. The inner conductor/coaxial via may be formed from a conductive material that may be formed within the opening, and may comprise a coaxial via structure. FIG. 1d (cross sectional view) depicts a coaxial via assembly 130, according to the embodiments herein. A coaxial via 116 may be coupled with a microstrip pad 109, and may extend from a top surface 125 of the board assembly 130 to a bottom surface 127. The microstrip pad 109, may be physically and electrically coupled to an internal stripline trace 113 through the coaxial via 116, and the outer conductor barrel/outer ground structure 106 may be physically disposed/coupled to both reference planes, (for example it may be disposed on and physically coupled to the reference planes 103, 103' that are disposed above the stripline 113. The coaxial via 116 may capture both return paths of the internal stripline 113.

Figure 2:
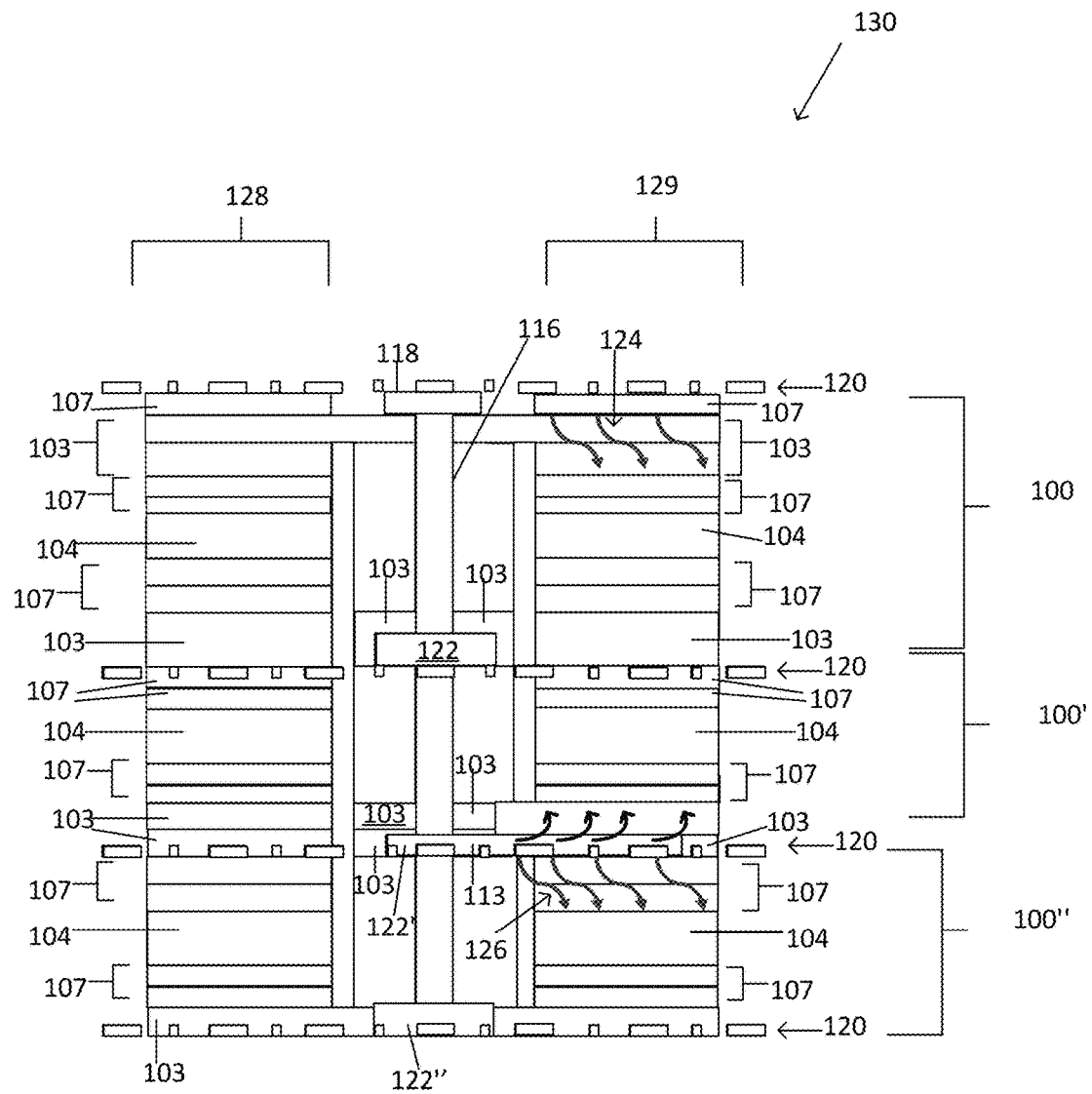
FIG. 2 represents a cross sectional view of structures according to embodiments.

In an embodiment, the coaxial via assembly/structure/board 130 may comprise multiple inner coaxial via board structures (shown as board segments 100, 100', 100') laminated together to form a completed coaxial via 116 extending from a top surface of the board assembly 130 to intersect with an internal trace 113 (FIG. 2). The coaxial via 116 may further extend beyond the internal trace to intersect/physically couple with a coaxial pad 122' located on a bottom portion of the coaxial via 116, wherein the coaxial pad 122' may be disposed below the internal trace 113. (FIG. 2). In an embodiment, each signal layer 120 may comprise a pad (for example, pads 122, 122', 122"), wherein a return path 126 for the strip line 113 is maintained. In an embodiment, the board 130 may comprise a first side 128 and a second side 129.

A microstrip return path 124 may be disposed on the same side (for example, side 129) as an internal strip line 113 return path 126. In an embodiment, the microstrip return path 124 may be disposed above the stripline return path 126 on the same side 129. In an embodiment, the coaxial via 116 may be coupled to the stripline trace 113, wherein the pad 122' may be disposed and physically and electrically coupled to the coaxial via 116 and the stripline trace 113. In an embodiment, the coaxial via assembly may comprise multiple internal coaxial vias, such as 122, 122'. The number of internal vias and laminated boards may vary depending upon the particular design requirements.

Current coaxial vias are useful for transitions between external layers as the return path is only on the adjacent layer. The embodiments herein capture two return path layers that a stripline trace may use as its high speed path. The embodiments enable the fabrication of an internal to internal coaxial via structure that fully captures the return path of a stripline conductor. The embodiments avoid the necessity of drilling a separate sub laminated board to create the coaxial via. The horse shoe structure enables the outer ground conductor to be maintained while not destroying the internal stripline pad, thus creating a coaxial via structure that can connect two internal strip line layers while capturing both return layers. The embodiments enable an impedance controlled via that also comprises noise immunity for nearby circuit structures which uniquely benefits high speed logic device, such as Dual Data Rate memory (DDR)/Peripheral Component Interconnect Express (PCIe) or universal serial bus (USB). The embodiments provide a seamless impedance transition to an internal layer with little to no crosstalk, thus enabling thicker backplanes which can support server applications, for example.

Figure 3:
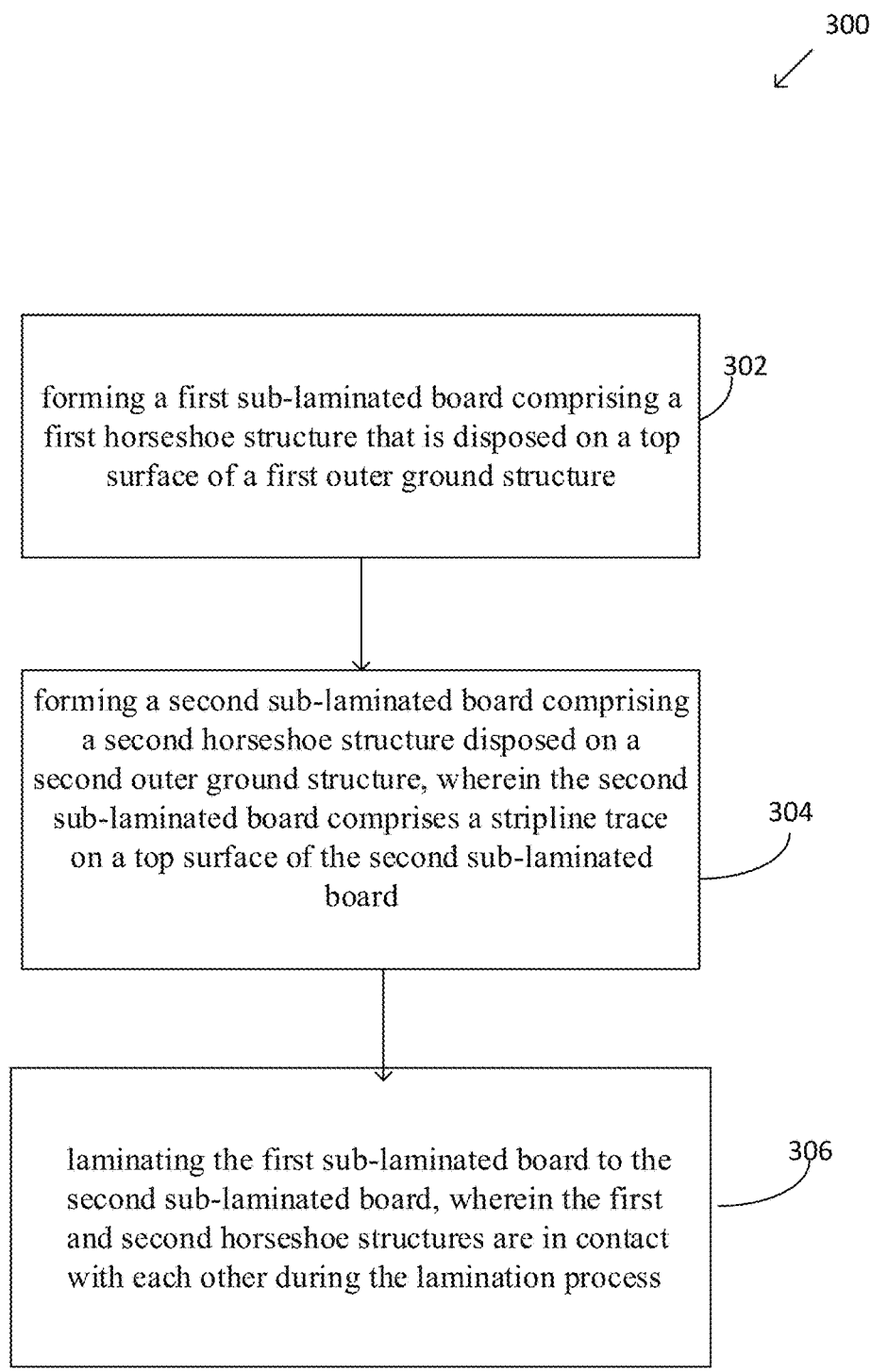
FIG. 3 represents a flow chart of a method according to embodiments.

FIG. 3 depicts a method 300 according to embodiments herein. At step 302, a first sub-laminated board may be formed comprising a first horseshoe structure that is disposed on a top surface of a first outer ground structure. The first sub-laminated board may comprise an outer ground structure, wherein a resin material may be disposed between the outer ground structure regions. At step 304, a second sub-laminated board comprising a second horseshoe structure disposed on a second outer ground structure may be formed, wherein the second sub-laminated board comprises a stripline trace on a top surface of the second sub-laminated board. The second sub-laminated ground structure may comprise a resin between the outer ground structure. At step 306, the first sub-laminated board may be laminated to the second sub-laminated board, wherein the first and second horseshoe structures are in contact with each other during the lamination process. An opening may be formed through a portion of the resin, wherein a conductive coaxial via may be formed in the opening. A return path of the internal stripline trace may comprise be fully captured by the outer ground structure.

The structures of the embodiments herein may be coupled with any suitable type of structures capable of providing electrical communications between a microelectronic device, such as a die, disposed in package structures, and a next-level component to which the package structures herein may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, a die(s) may be partially or fully embedded in a package structure.

The various embodiments of the device/package structures included herein may be used for system on a chip (SOC) products, and may find application in such devices as smart phones, notebooks, tablets, wearable devices and other electronic mobile devices. In various implementations, the package structures herein may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 4:
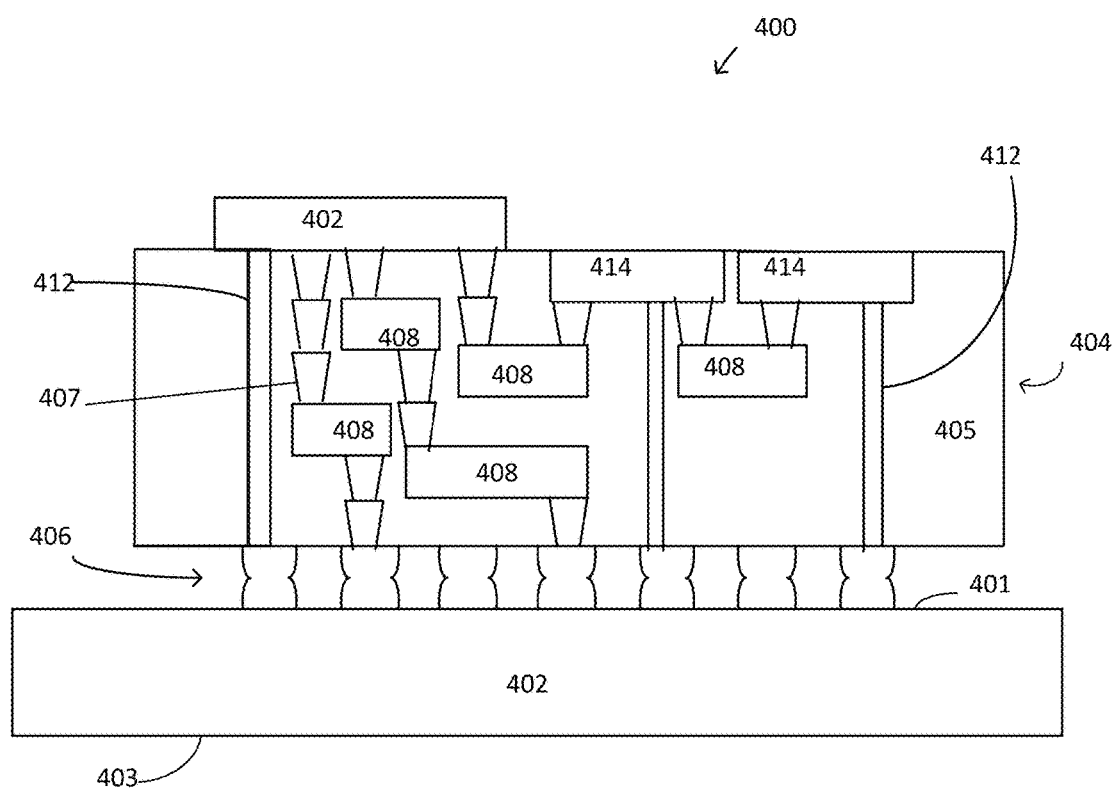
FIG. 4 represents a cross sectional view of a computer system implementing one or more embodiments.

Turning now to FIG. 4, illustrated is an embodiment of a computing system 400. The system 400 includes a mainboard 402 or other circuit board. Mainboard 402 includes a first side 401 and an opposing second side 403, and various components may be disposed on either one or both of the first and second sides 401, 403. In the illustrated embodiment, the computing system 400 includes at least one die 402, disposed on a surface (such as on a top or bottom or side surface) of the substrate 404, such as a package substrate comprising the coaxial via structures/boards of the various embodiments herein. The substrate 404 may comprise an interposer 404, for example, and may comprise any of the embodiments of the coaxial via structures/boards herein.

The substrate 404 may comprise various levels of conductive layers 413, for example, which may be electrically and physically connected to each other by via structures 407. The conductive layers 413 may comprise conductive traces in an embodiment.

The substrate 404 may further comprise through substrate vias 412. Dielectric material 405 may separate/isolate conductive layers from each other within the substrate 404. Joint structures 406 may electrically and physically couple the substrate 404 to the board 402. The computing system 400 may comprise any of the embodiments described herein.

System 400 may comprise any type of computing system, such as, for example, a hand-held or mobile computing device (e.g., a cell phone, a smart phone, a mobile internet device, a music player, a tablet computer, a laptop computer, a net top computer, etc.). However, the disclosed embodiments are not limited to hand-held and other mobile computing devices and these embodiments may find application in other types of computing systems, such as desk-top computers and servers.

Mainboard 402 may comprise any suitable type of circuit board or other substrate capable of providing electrical communication between one or more of the various components disposed on the board. In one embodiment, for example, the mainboard 402 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 401. However, it should be understood that the disclosed embodiments are not limited to the above-described PCB and, further, that mainboard 401 may comprise any other suitable substrate.

Figure 5:
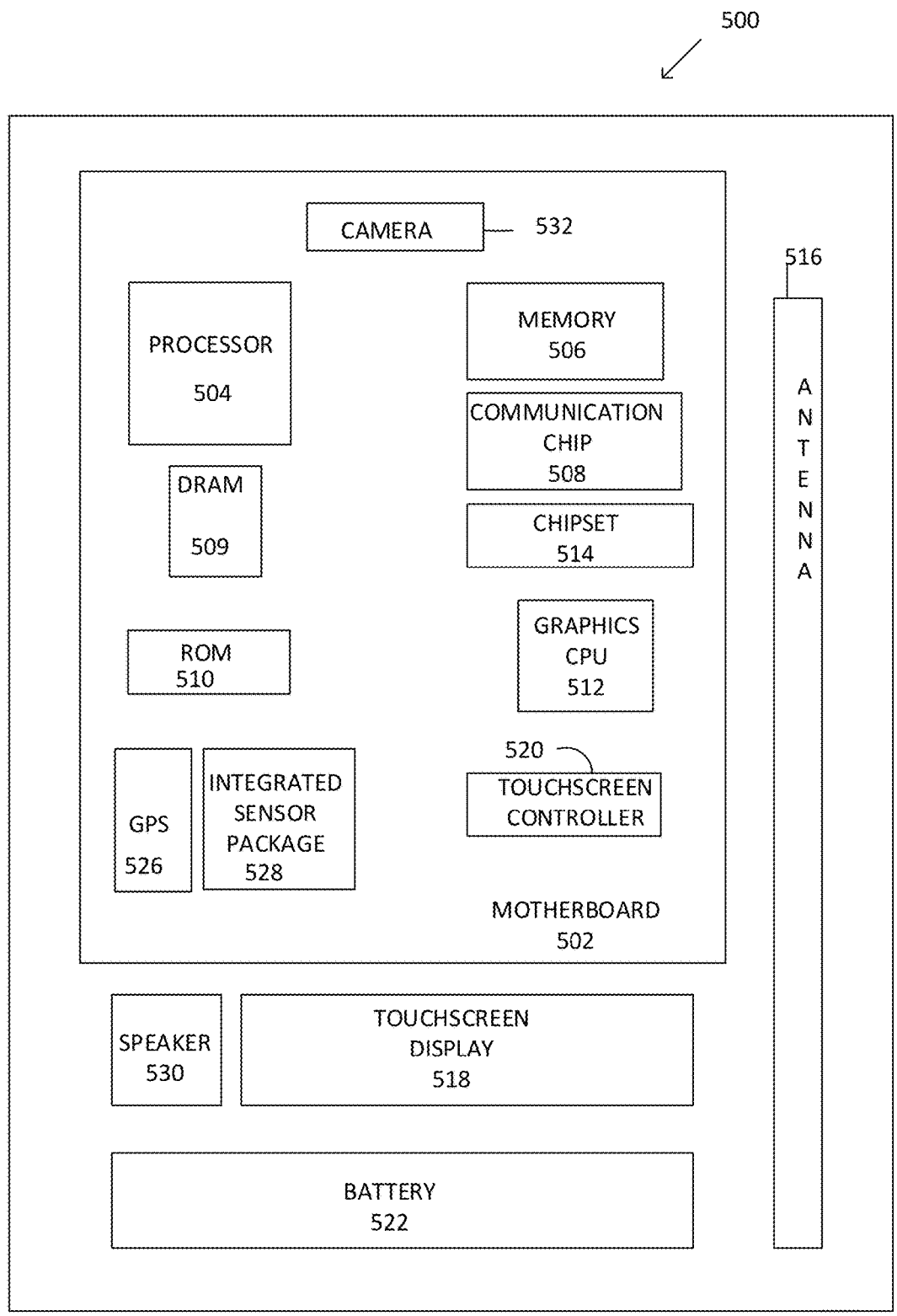
FIG. 5 represents a schematic of a computing device according to embodiments.

FIG. 5 is a schematic of a computing device 500 that may be implemented incorporating embodiments of the package structures described herein. For example, any suitable ones of the components of the computing device 500 may include, or be included in, package structures comprising the coaxial via structures of the various embodiments disclosed herein. In an embodiment, the computing device 500 houses a board 502, such as a motherboard 502 for example. The board 502 may include a number of components, including but not limited to a processor 504, an on-die memory 506, and at least one communication chip 508. The processor 504 may be physically and electrically coupled to the board 502. In some implementations the at least one communication chip 508 may be physically and electrically coupled to the board 502. In further implementations, the communication chip 508 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 509, non-volatile memory (e.g., ROM) 510, flash memory (not shown), a graphics processor unit (GPU) 512, a chipset 514, an antenna 516, a display 518 such as a touchscreen display, a touchscreen controller 520, a battery 522, an audio codec (not shown), a video codec (not shown), a global positioning system (GPS) device 526, an integrated sensor 528, a speaker 530, a camera 532, an amplifier (not shown), compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond.

The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra-mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising a package substrate comprising a coaxial via that extends from a top surface to a bottom surface of the package substrate, wherein a coaxial pad is disposed on a bottom portion of the coaxial via, a stripline physically coupled within the substrate to the coaxial via, wherein the strip line comprises an internal stripline, and is disposed above the coaxial pad, and a microstrip trace disposed on a top surface of the package substrate, wherein the microstrip trace is electrically coupled to the internal stripline.

Example 2 includes the microelectronic package structure of example 1, wherein a microstrip pad is disposed over the internal stripline.

Example 3 includes the microelectronic package structure of example 1 wherein an outer ground structure is disposed on two reference planes.

Example 4 includes the microelectronic package structure of example 1 wherein a return path for the microstrip trace is on the same side as a return path for the internal strip line.

Example 5 includes the microelectronic package structure of example 1 wherein the coaxial via comprises an internal to internal transition structure.

Example 6 includes the microelectronic package structure of example 1 wherein the package structure comprises at least two internal coaxial via structures.

Example 7 includes the microelectronic package structure of example 1 wherein a return path of the stripline trace is fully captured by the outer ground structure.

Example 8 includes the microelectronic package structure of example 1 wherein a microstrip pad is disposed on a resin material between an outer ground structure.

Example 9 is a microelectronic package structure comprising: a package substrate comprising a coaxial via, wherein the coaxial via extends at least partially through the package substrate; at least one signal layer, wherein each signal layer is physically coupled with a coaxial via pad, wherein each coaxial via pad is physically coupled to the coaxial via in between an outer ground structure; and an internal stripline physically and electrically coupled to the coaxial via.

Example 10 includes the microelectronic package structure of example 9 wherein a microstrip trace is physically and electrically coupled to the internal stripline through the coaxial via.

Example 11 includes the microelectronic package structure of example 9 wherein the outer ground structure is physically coupled to a first reference plane that is physically disposed on a first side of the package structure, and is physically coupled with a second reference plane that is physically disposed on a second side of the package structure.

Example 12 includes the microelectronic package structure of example 11 wherein a return path for the microstrip trace is on the same side as a return path for the internal strip line.

Example 13 includes the microelectronic package structure of example 9 wherein a return path of the stripline trace is fully captured by the outer ground structure.

Example 14 includes the microelectronic package structure of example 9 wherein the package structure comprises at least two internal coaxial via structures.

Example 15 includes the microelectronic package structure of example 14 wherein the internal stripline is disposed adjacent a resin material that is adjacent the coaxial via.

Example 16 includes the microelectronic package structure of example 9, wherein the coaxial via comprises an impedance controlled via.

Example 17 is a method of forming a microelectronic package structure, comprising: forming a first sub-laminated board comprising a first horse shoe structure that is disposed on a top surface of a first outer ground structure; forming a second sub-laminated board comprising a second horse shoe structure disposed on a second outer ground structure, wherein the second sub-laminated board comprises a stripline trace on a top surface of the second sub-laminated board; and laminating the first sub-laminated board to the second sub-laminated board, wherein the first and second horse shoe structures are in contact with each other during the lamination process.

Example 18 includes the method of example 17 further comprising wherein the first and second sub-lamination boards comprise a resin material disposed between each of the first and second outer ground structures.

Example 19 includes the method of example 18 wherein an opening is formed in the resin extending from a top surface of the laminated first and second sub-laminated boards to a bottom surface of the first and second sub-laminated boards.

Example 20 includes the method of example 19 further comprising wherein a conductive material is formed within the opening.

Example 21 includes the method of example 17 wherein the conductive material comprises a coaxial via comprising at least one coaxial pad disposed between an outer ground structure.

Example 22 includes the method of example 19 wherein the opening is formed through a portion of the strip line trace.

Example 23 includes the method of example 17 further comprising wherein a return path for a microstrip trace disposed on a top surface of the laminated first and second sub-laminated boards is on the same side as a return path for the internal strip line.

Example 24 includes the method of example 17 further comprising wherein a return path of the stripline trace is fully captured by the outer ground structure.

Example 25 includes the method of example 23 wherein the microstrip trace is electrically coupled to the internal stripline.

Example 26 includes the microelectronic package structure of example 9 further comprising a system comprising: a communication chip communicatively coupled to the microelectronic structure; and a DRAM communicatively coupled to the communication chip.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic package structure comprising:
   a package substrate;
   a coaxial via that extends from a top surface to a bottom surface of the package substrate, wherein a coaxial pad is on a bottom portion of the coaxial via adjacent the bottom surface of the package;
   an internal stripline trace physically coupled within the package substrate to the coaxial via, wherein the internal strip line trace is above the coaxial pad, and wherein the coaxial via extends through the internal stripline trace to the coaxial pad;
   at least two internal coaxial via structures, wherein each of the at least two internal coaxial via structures comprises a coaxial via portion on an internal coaxial via pad; and
   a microstrip trace on a top surface of the package substrate, wherein the microstrip trace is electrically coupled to the internal stripline trace.

2. The microelectronic package structure of claim 1, wherein a microstrip pad is over the internal stripline trace.

3. The microelectronic package structure of claim 1 wherein an outer ground structure is adjacent the coaxial via.

4. The microelectronic package structure of claim 1 wherein a return path for the microstrip trace is on the same side as a return path for the internal strip line trace.

5. The microelectronic package structure of claim 1 wherein the coaxial via comprises an internal to internal transition structure.

6. The microelectronic package structure of claim 3 wherein a return path of the internal stripline trace is fully captured by the outer ground structure.

7. The microelectronic package structure of claim 3 wherein a microstrip pad is over a resin material, wherein the resin material is between the outer ground structure and the coaxial via.

8. A microelectronic package structure comprising:
   a package substrate comprising a coaxial via, wherein the coaxial via extends at least partially through the package substrate;
   a first signal layer physically coupled with a first coaxial via pad, wherein the first coaxial via pad is physically coupled to the coaxial via;
   a second signal layer physically coupled with a second coaxial via pad, wherein the second coaxial via pad is physically coupled to the coaxial via, and wherein the coaxial via extends through the first and the second coaxial via pads, and wherein the first and the second coaxial via pads are adjacent an outer ground structure and a resin material;

an internal stripline trace physically and electrically coupled to the coaxial via, wherein the coaxial via extends through the internal stripline trace, and wherein the internal stripline trace is between the first and the second coaxial via pads; and at least two internal coaxial via structures, wherein each of the at least two internal coaxial via structures comprises a coaxial via portion disposed on an internal coaxial via pad.

9. The microelectronic package structure of claim 8 wherein a microstrip trace is physically and electrically coupled to the internal stripline trace through the coaxial via, and is above the internal stripline trace.

10. The microelectronic package structure of claim 8 wherein the outer ground structure is physically coupled to a first reference plane that is physically on a first side of the package structure, and is physically coupled with a second reference plane that is physically on a second side of the package structure.

11. The microelectronic package structure of claim 9 wherein a return path for the microstrip trace is on the same side as a return path for the internal strip line trace.

12. The microelectronic package structure of claim 8 wherein a return path of the internal stripline trace is fully captured by the outer ground structure.

13. The microelectronic package structure of claim 8 wherein the internal stripline trace is adjacent a resin material that is adjacent the coaxial via.

14. The microelectronic package structure of claim 8, wherein the coaxial via comprises an impedance controlled via.

15. A method of forming a microelectronic package structure, comprising:

forming a first sub-laminated board comprising a first horse shoe structure that is on a top surface of a first outer ground structure;

forming a second sub-laminated board comprising a second horse shoe structure on a second outer ground structure, wherein the second sub-laminated board comprises a stripline trace on a top surface of the second sub-laminated board; and laminating the first sub-laminated board to the second sub-laminated board, wherein the first and second horse shoe structures are in contact with each other during the lamination process.

16. The method of claim 15 further comprising wherein the first and second sub-lamination boards comprise a resin material between each of the first and second outer ground structures.

17. The method of claim 16 wherein an opening is formed in the resin extending from a top surface of the first and second sub-laminated boards to a bottom surface of the first and second sub-laminated boards.

18. The method of claim 17 further comprising wherein a conductive material is formed within the opening.

19. The method of claim 15 wherein the conductive material comprises a coaxial via comprising at least one coaxial pad between an outer ground structure.

20. The method of claim 17 wherein the opening is formed through a portion of the strip line trace.

21. The method of claim 15 further comprising wherein a return path for a microstrip trace on a top surface of the laminated first and second sub-laminated boards is on the same side as a return path for the strip line trace.

22. The method of claim 21 wherein the microstrip trace is electrically coupled to the stripline trace.

23. The method of claim 15 further comprising wherein a return path of the stripline trace is fully captured by the outer ground structure.

* * * * *